(12) United States Patent
Sandhu

(10) Patent No.: US 6,410,453 B1
(45) Date of Patent: Jun. 25, 2002

(54) METHOD OF PROCESSING A SUBSTRATE

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/391,078

(22) Filed: Sep. 2, 1999

(51) Int. Cl.$^7$ .................... H01L 21/302; H01L 21/461
(52) U.S. Cl. .................. 438/736; 438/671; 438/717; 438/950; 438/952
(58) Field of Search ........................... 938/396, 950, 938/736, 717, 945, 952, 551, 671

(56) References Cited

U.S. PATENT DOCUMENTS

| | | | |
|---|---|---|---|
| 4,165,395 A | * 8/1979 | Chang | 427/43 |
| 4,557,797 A | * 12/1985 | Fuller et al. | 156/643 |
| 4,745,044 A | * 5/1988 | Gregor | 430/312 |
| 5,292,677 A | 3/1994 | Dennison | 437/52 |
| 5,338,700 A | 8/1994 | Dennison et al. | 437/60 |
| 5,362,666 A | 11/1994 | Dennison | 437/52 |
| 5,376,227 A | * 12/1994 | Lee | 156/643 |
| 5,378,654 A | 1/1995 | Hsue | 437/195 |
| 5,407,529 A | * 4/1995 | Homma | 156/643 |
| 5,597,763 A | 1/1997 | Sim | 437/195 |
| 5,651,855 A | 7/1997 | Dennison et al. | 156/636.1 |
| 5,665,251 A | 9/1997 | Robertson et al. | 216/22 |
| 5,670,404 A | 9/1997 | Dai | 437/52 |
| 5,830,624 A | 11/1998 | Bae et al | 430/323 |
| 5,959,325 A | * 9/1999 | Adair et al. | 257/302 |
| 6,190,989 B1 | 2/2001 | Roberts | 438/396 |
| 6,221,711 B1 | 4/2001 | Roberts et al. | 438/239 |

* cited by examiner

Primary Examiner—Richard Elms
Assistant Examiner—Adam J. Pyonin
(74) Attorney, Agent, or Firm—Howrey Simon Arnold & White, LLP

(57) ABSTRACT

A method of fabricating a mask forms a rectangular opening within etch resistant material that overlays a substrate. The mask preferably comprises two layers of photoresist separated by a layer of light blocking material. One of the layers of photoresist is patterned per a longitudinal exposure strip, and the other per an overlap of a lateral exposure strip with the longitudinal exposure strip, so as to provide an opening for the mask where the two overlap. With this mask over a substrate, the substrate is etched to form a container therein with a rectangular cross-section corresponding to the aperture of the mask. The container is then lined with electrically conductive material, dielectric, and electrically conductive material respectively to form a capacitor in the container—e.g., a container-cell capacitor for a DRAM device.

50 Claims, 10 Drawing Sheets

METHOD OF PROCESSING A SUBSTRATE

BACKGROUND OF THE INVENTION

The present invention relates to a mask suitable for use in forming a container in a substrate, and more specifically to a mask having a fine geometry, rectangular opening that may be utilized to etch a substrate and define an opening or hole therein having an outline corresponding to the rectangular opening of the mask. Additionally, the present invention relates to a container-cell capacitor for a dynamic random access memory (DRAM).

An exemplary prior art dynamic random access memory (DRAM) device comprises an array of container-cell capacitors that are formed in a substrate. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above.

One known container structure for the container-cell capacitors of a memory array, comprises a container having cylindrical or "bath-tub" shape. In a known method of fabricating a container in a substrate, with reference to FIGS. 1–3, a single layer of photoresist 12 is coated over layer 10 of, for example, borophosphosilicate glass (BPSG). Light 14, such as ultraviolet light, irradiates a select region 16 of photoresist 12 as determined by an exposure plate or reticle (not shown). Advancing to FIG. 2, photoresist 12 is developed to form opening 18. Opening 18 exposes surface 20 of layer 10. With this mask 12, layer 10 can be etched (e.g., by a reactive plasma etch) to form container 19 within layer 10, see FIG. 3. As used herein, the term "container" shall be inclusive of similar structural descriptors such as void, pocket, hole, contact opening, via and the like. A radius of curvature r1 of the container corresponds to the radius of curvature of opening 18 of mask 12. To form a capacitor, container 19 is lined with first conductive material, dielectric, and second conductive material layers respectively.

In order to minimize costs, manufactures of DRAM's strive to reduce the dimensions of the container-cell capacitors and increase the density of such cells within the array. Accordingly, some have developed a container-cell capacitor having a primarily rectangular cross-section for providing increased capacitance without sacrificing cell density. Referencing FIGS. 4A and 4B, such exemplary prior art container 19 comprises a cross-section of rectangular outline 23 offering an increase in the area of the container walls. This increased area, in-turn, increases the electrode area and capacitance value of the container-cell over that which might otherwise be provided by an equivalent width cylindrical container 18.

In a prior art method of forming a mask with a rectangular aperture, referencing FIGS. 5A and 5B, insulating material 10, e.g., BPSG, is layered over a silicon wafer of a supporting substrate 21. Etch resistant material 96 is layered over insulating material 10. Etch resistant material 96 is capable of resisting an etchant that is used during subsequent etching of insulating material 10, and may comprise, e.g., nitride of about 1,000 angstroms thickness. Photoresist (not shown) is layered over the top of etch resistant material 96 and patterned to define lateral apertures therein. The lateral apertures of the photoresist are used to define lateral openings 100 into etch resistant material 96. After forming lateral openings 100 in etch resistant material 96, the first photoresist is removed.

Continuing with this particular, exemplary, prior art method, additional photoresist 94 is applied over the patterned etch resistant material 96. This new photoresist is patterned to define longitudinal openings 106 that overlap lateral openings I 00, thereby defining rectangular openings 18 (FIG. 5B) at overlapping regions. Thereafter, select regions of substrate 21 are processed or etched in accordance with the openings to define containers 19. In this exemplary prior art method of forming a rectangular opening for a mask, the second photoresist is layered over the substrate and processed only after the first, lower photoresist has been fully processed. In other words, the lower photoresist is processed first, and only then is the upper layer of photoresist coated thereover and processed.

After forming this mask opening, the substrate is etched in accordance with the rectangular opening of the patterned photoresist and lower mask material, so as to provide a container within the substrate having primarily a rectangular cross-section corresponding to the rectangular opening of the mask.

In the above, exemplary, prior art method of forming a mask with a rectangular aperture, the upper photoresist is applied to the substrate only after the lower mask material has already been processed to define the lateral opening therein. In other words, the exemplary prior art sequence of steps comprises, in general, processing the first mask material, applying photoresist over the first mask material, followed by processing the photoresist. With this sequence of steps, the substrate is moved from, firstly, an etch or development station associated with processing the first mask material; to, secondly, a photoresist coat station for applying the photoresist over the processed mask material; and then back to, thirdly, an etch or resist development station to define the longitudinal openings in the photoresist. Recognizing a need in the manufacture of semiconductors to reduce handling and travel of wafers during semiconductor production flows, so as to reduce the time and costs associated with such wafer transport, the present invention proposes a new mask and method of manufacture thereof that can provide for effective and efficient semiconductor production flows.

Accordingly, the present invention provides a new mask and method of manufacture thereof, for use in forming a container for a container-cell capacitor having a rectangular cross-section, which mask and method of manufacture are capable of overcoming some of the above limitations. Furthermore, an array of containers are formed in a substrate by etching a substrate in accordance with fine geometry openings of such mask, providing for an efficient process flow.

SUMMARY OF THE INVENTION

In accordance with a first embodiment of the present invention, a method of forming a mask comprises layering radiation blocking material over a layer of first radiation sensitive material, such as photoresist. The radiation blocking material is patterned to provide a first opening therein that uncovers a portion of the layer of radiation sensitive material. Next, the layered structure is irradiated in accordance with an exposure pattern that overlaps a portion of the first opening, thereby irradiating a region of the lower radiation sensitive material. The radiation sensitive material is then developed to remove the irradiated region thereof and form an opening for the mask.

In accordance with one aspect of this embodiment, a second layer of radiation sensitive material, e.g., photoresist, is layered over the layer of radiation blocking material and patterned to provide a longitudinal opening therein and uncover a corresponding region of the radiation blocking material. A visible portion of the radiation blocking material is removed using the patterned, second layer of radiation sensitive material as a mask, thereby forming the first opening in the radiation blocking material.

Preferably, the second layer of radiation sensitive material is provided a longitudinal opening, and the lower layer of radiation sensitive material is irradiated using a lateral exposure strip that overlaps the longitudinal opening.

In accordance with one aspect of the invention, a DARC (dielectric antireflective coat) layer is provided between the light blocking material and the second photoresist.

In a further embodiment of the present invention, a mask, as outlined above, is formed over a substrate. Again, the second layer of radiation sensitive material has been patterned to provide a longitudinal opening, and lower layer of radiation sensitive material irradiated using a lateral exposure strip that overlaps the longitudinal opening to provide for a rectangular overlap region. The exposed, rectangular overlap region is developed to provide a mask aperture having a rectangular outline. Through this mask aperture, select regions of the substrate are etched to form a container therein with a rectangular cross-section corresponding to the rectangular outline of the mask aperture.

In accordance with one aspect of this embodiment, a capacitor is formed within the container, thereby providing a container-cell capacitor with a rectangular cross-section.

In accordance with yet another embodiment of the present invention, a mask comprises a layer of first photoresist, a layer of light blocking material over the first photoresist, and second photoresist over the light blocking material. A dielectric antireflective coat (DARC) is provided over the light blocking material and beneath the second photoresist. In accordance with one aspect of this embodiment, at least one of the first and second photoresists is patterned per a longitudinal exposure strip, and the other per a lateral exposure strip. The first one comprises an opening corresponding to the longitudinal exposure strip, and the other an opening corresponding to an overlap of the longitudinal and lateral exposure strips.

BRIEF DESCRIPTION OF THE DRAWINGS

The present invention will be understood from reading the following description of particular embodiments, with reference to the attached drawings as illustrated below, where.

DETAILED DESCRIPTION OF THE PREFERRED EMBODIMENTS

The present invention proposes a mask with a rectangular opening, and a new method of forming such mask which can facilitate an easy process flow that can be used, for example, in production of Dynamic Random Access Memory.

Figure 10:
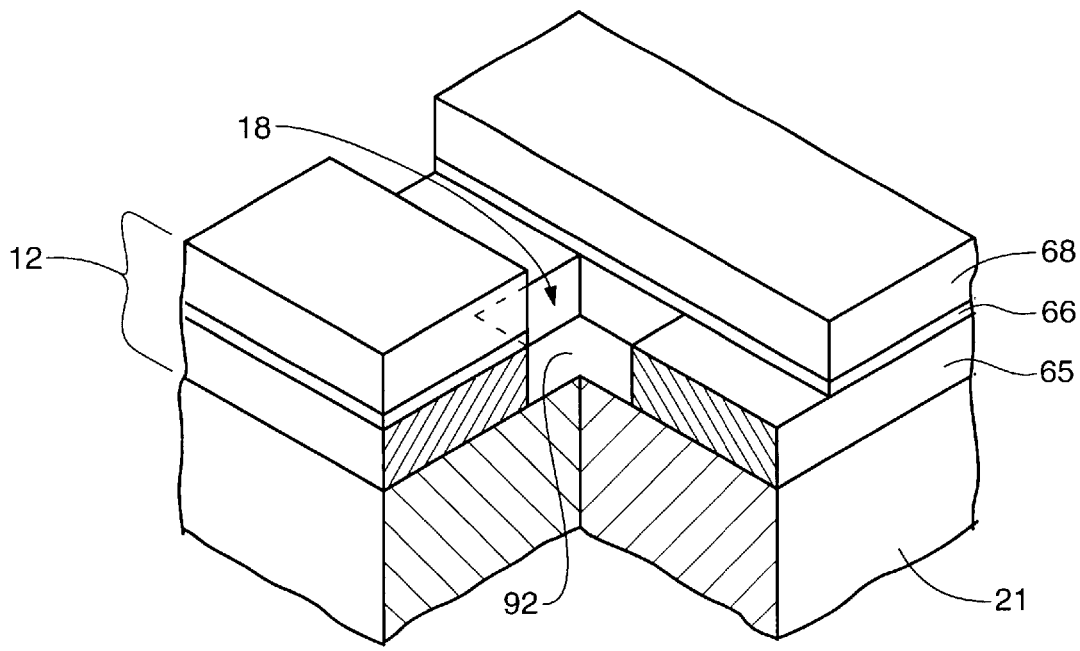

In accordance with an exemplary embodiment of the present invention, skipping forward with reference to FIG. 10, mask 12 comprises first and second layers 65,68 of radiation sensitive material separated by a layer 66 of radiation blocking material. In accordance with one aspect of this embodiment, layers 65,68 comprise known photoresist of about 0.5–1.0 m thickness and layer 66 comprises a metal, for example, aluminum, of less than 1000 angstroms thickness, and more preferably between 500 and 600 angstroms. In an alternative exemplary embodiment, referencing FIG. 6A, layer 66' further comprises a dielectric antireflective coat (i.e., DARC) layered adjacent light blocking material 84. In one aspect of this exemplary embodiment, a DARC layer 85 is formed over the layer of radiation blocking material 84 and below photoresist 68. In a further aspect of this exemplary embodiment, a DARC layer 83 is also provided over photoresist 65 and beneath the layer of radiation blocking material 84. For these exemplary embodiments, DARC layer comprise a material and thickness—e.g., α-Si or $Si_xO_yN_z$ of about 200–1000 angstroms—appropriate for minimizing reflections of the associated process irradiation, e.g., ultraviolet light.

Turning to a method of forming such mask, with reference to FIGS. 6–11, first photoresist 65 is layered over substrate 21, with a thickness of about 3000–10,000 angstroms. Again, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above.

Figure 1:
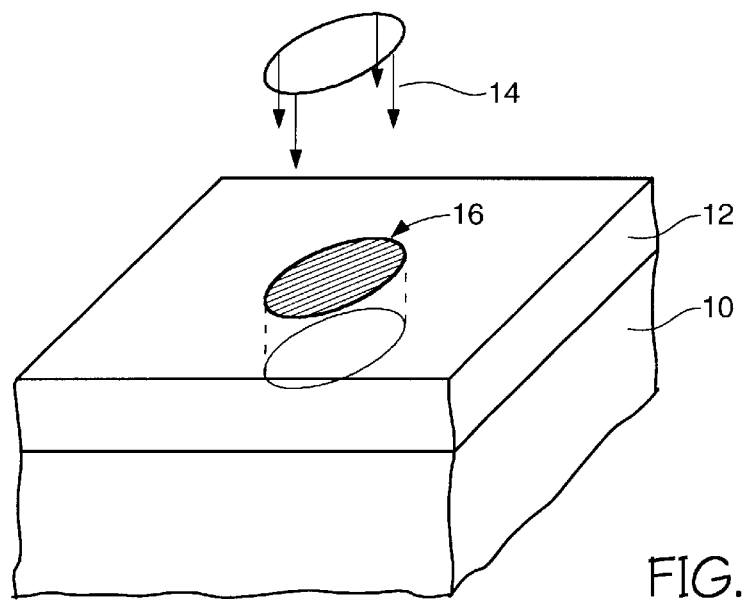
FIGS. 1–3 are partial, cross-sectional, isometric views representative of a known method of forming a known mask and cylindrical container.
Figure 2:
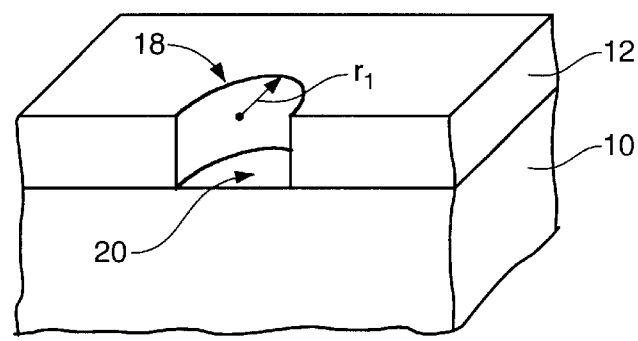
Figure 3:
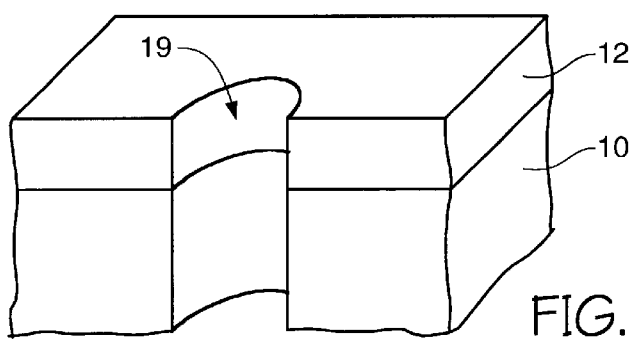
Figure 4A:
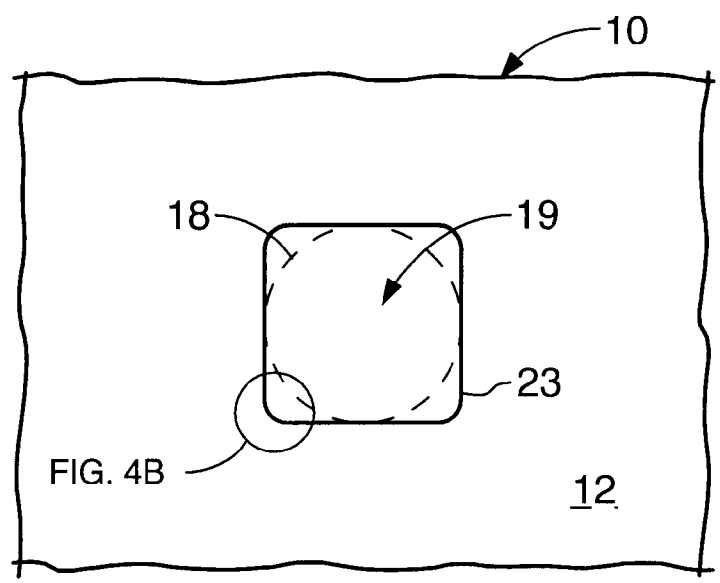
FIGS. 4A–4B show planar and exploded views illustrating generally a mask over a substrate.
Figure 4B:
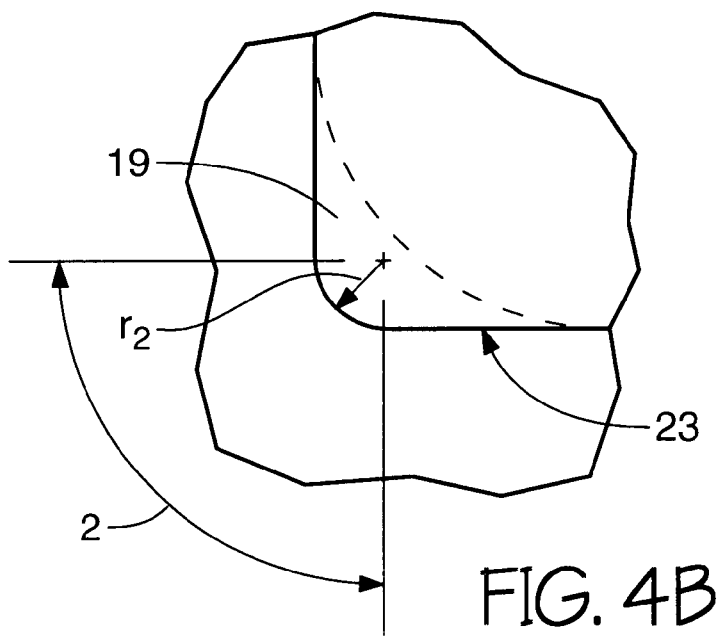
Figure 5A:
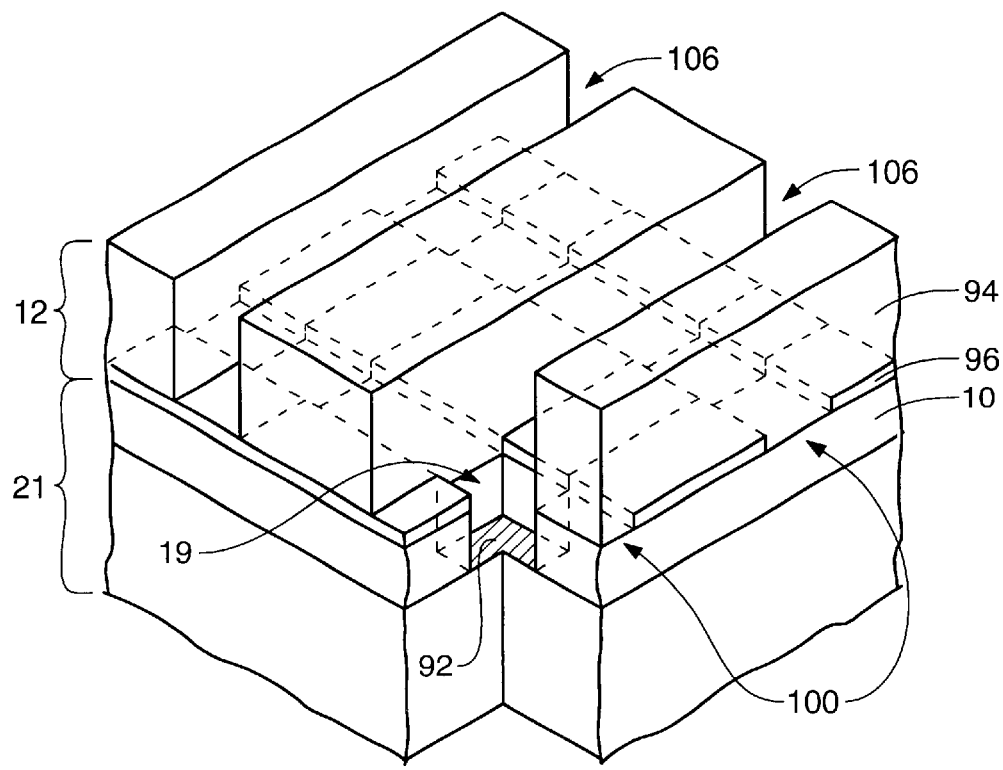
FIG. 5A provides a partially sectioned, isometric view of a prior art mask and container.
Figure 5B:
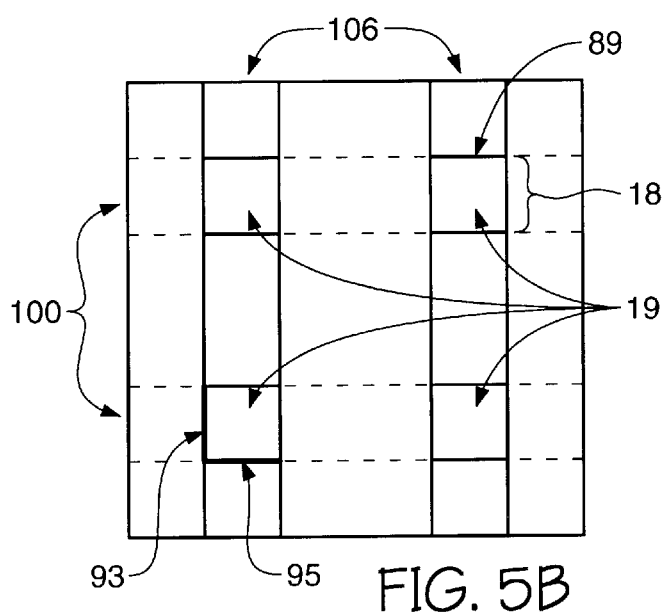
FIG. 5B is a planar view of FIG. 5A, illustrating generally a mask aperture over an underlying substrate.
Figure 6:
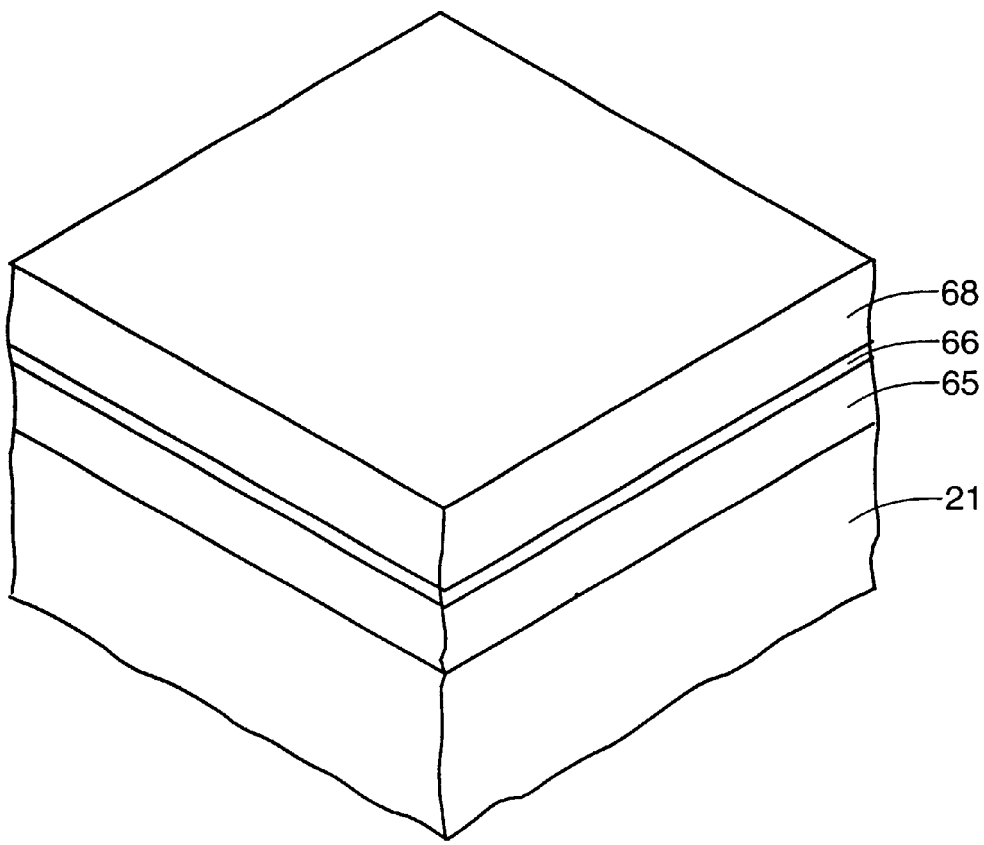
FIGS. 6–10 provide exemplary, isometric and cross-sectional views illustrating generally fabrication of a mask in accordance with an embodiment of the present invention.

Further referencing FIG. 6, layer 66 comprises radiation (e.g., light) blocking material and is deposited over first photoresist 65. In an exemplary embodiment, the photoresist is sensitive to ultraviolet light and the radiation blocking material opaque to the ultraviolet light. In accordance with such embodiment, the radiation blocking material comprises a metal, for example, aluminum of 200–1,000 angstroms thickness. Next, another layer of photoresist 68 (preferably sensitive to ultraviolet light) is layered over layer 66 of the radiation blocking material.

Figure 6A:
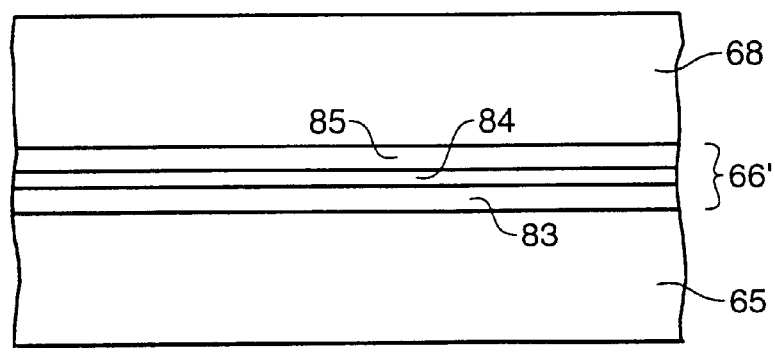

As discussed above in accordance with certain exemplary embodiments, a dielectric antireflective coat 85 can be formed on the layer of radiation blocking material 84, as shown in FIG. 6A, for provision beneath photoresist 68. Additionally, a dielectric antireflective coat 83 might also be formed over photoresist 65 for provision beneath radiation blocking material 84.

Preferably, the material(s) of layer 66, or 66', are formed over photoresist 65 under conditions preserving the integrity of lower photoresist 65. For example, the DARC and/or radiation blocking material layers should be deposited using known chemical vapor deposition or sputtering methods at temperatures less than 200° C.

Figure 7:
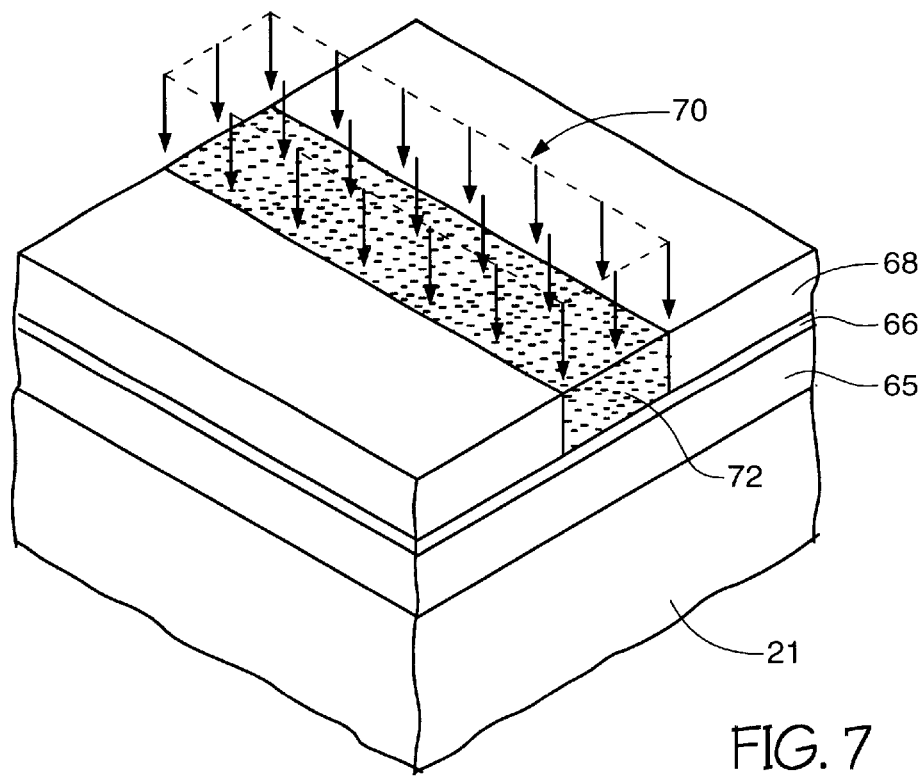
Figure 8:
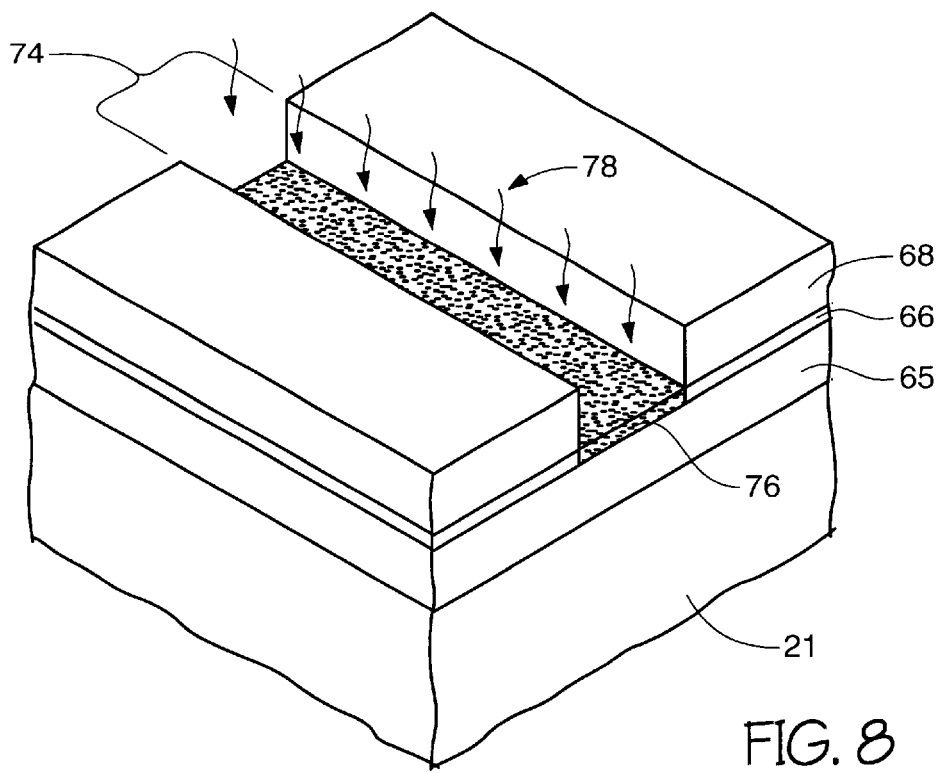

With reference to FIG. 7, the upper layer of a photoresist 68 is irradiated 70, in a preferred embodiment using ultraviolet light, using a reticle (not shown) to pattern a longitudinal irradiated region or exposure strip 72 on photoresist 68. The irradiated region of the photoresist is developed to form longitudinal opening 74 therein as shown in FIG. 8. Opening 74 uncovers a corresponding surface region of layer 66 comprising radiation blocking material. Using the patterned, upper photoresist 68 as a mask, the uncovered region 76 of layer 66 is etched—e.g., using a reactive ion plasma 78—until reaching and uncovering a corresponding portion of the lower photoresist 65. In an exemplary embodiment, the layer of radiation blocking material is etched using a known anisotropic etchant. Additionally, a brief isotropic finishing etch may be employed after the anisotropic etch so as to remove undesirable "stringers" or "slivers," which mat not have completely cleared the etch window of the preceding anisotropic etch.

Figure 9:
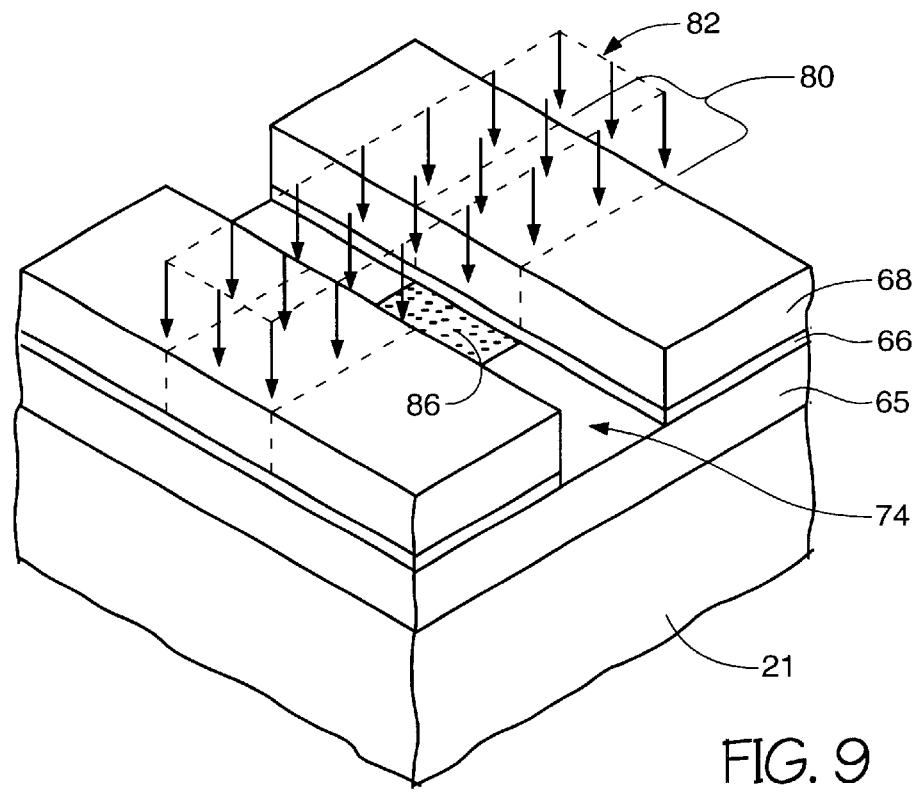

Continuing with reference to FIG. 9, another exposure 82 irradiates a lateral exposure strip 80 of the layered substrate structure and exposes region 86 of lower photoresist 65. Exposed region 86 of photoresist 65 is defined by where lateral exposure strip 80 overlaps longitudinal opening 74. Preferably, lateral exposure strip 82 overlaps longitudinal opening 74 with its primary axis perpendicular to that of the longitudinal opening. The photoresist is then developed to remove its irradiated region 86, thereby providing mask 12 with an opening 18 as shown in FIG. 10. In accordance with an alternative exemplary embodiment, the upper layer of photoresist 68 can be removed (leaving light blocking material 66) before the exposure and patterning of the lower layer photoresist 65.

In the exemplary embodiment depicted by FIG. 10, opening 18 has a rectangular outline that exposes a corresponding region 92 of substrate 21. Accordingly, the select visible region 92 of substrate 21 can then be processed, as permitted through opening 18 of mask 12. In a particular exemplary embodiment, select region 92 of substrate 21 is etched through opening 18 of mask 12, so as to form a void, pocket, hole, contact opening, via or container (hereinafter container) within the substrate having an outline corresponding to that of mask opening 18. In alternative exemplary applications, mask 12 can be used during deposition or implant of the select region 92 of substrate 21.

Figure 11:
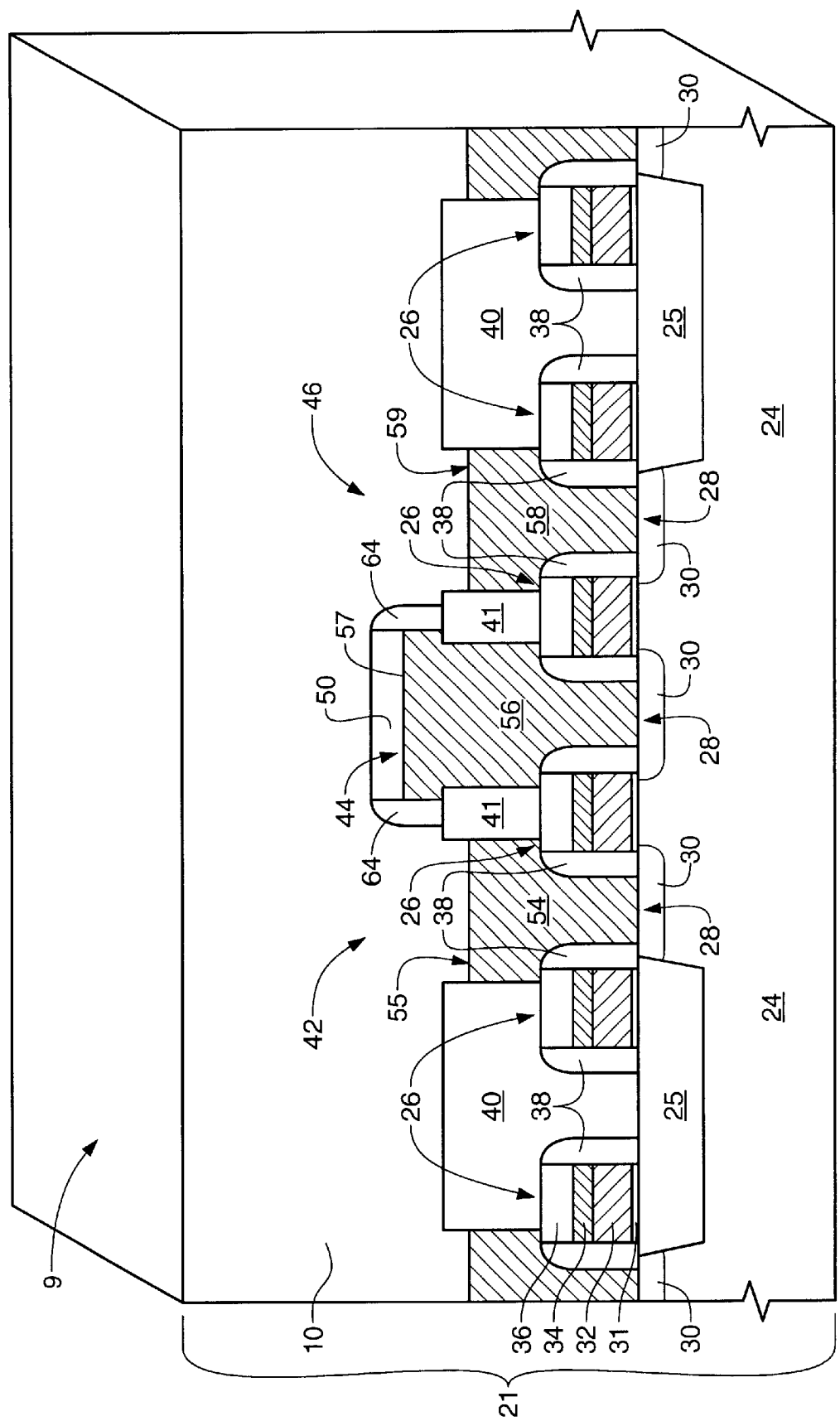
FIGS. 11–14 provide exemplary cross-sectional isometric views illustrating, generally, fabrication of a container-cell capacitor in accordance with an embodiment of the present invention.

Moving on to a particular, exemplary embodiment, with reference to FIG. 11, substrate 21 comprises a known silicon wafer 24 that has already been processed through some of the steps in the production of a dynamic random access memory. Field-oxide regions 25 isolate various active regions of wafer 24. Wordlines 26 are disposed across the surface of wafer 24. The wordlines comprise poly 32 covered with silicide 34, both encapsulated by insulating materials of cap 36 and sidewalls 38. Cap 36 and sidewalls 38 prevent the silicide 34 and poly 32 of wordlines 26 from contacting and electrically shorting to neighboring electrically conductive plugs 54,56,58. Diffusion nodes 30 have been doped to provide electrically conductive regions within silicon wafer 24. Plugs 54,56,58 comprise electrically conductive material which electrically interconnect to their respective diffusion nodes 30. Insulating materials 41,50,64 around the walls of plug 56, serve to insulate plug 56 from adjacent plugs 54,58. Insulating material 40, disposed above and between certain wordlines over the field-oxide isolation regions 25, serve to separate the various memory cell units from their adjacent other memory cell units. Insulating material 10 overlays wafer 24 and its various wordline and plug structures. In an exemplary embodiment, insulating material 10 comprises an oxide such as borophosphosilicate glass (BPSG) or tetraethylorthosilicate (TEOS) deposited silicon. Preferably, the outwardly facing surface 9 of insulating material 10 has been planarized, for example, by a known planarization process such as chemical-mechanical-polishing (CMP).

Figure 12:
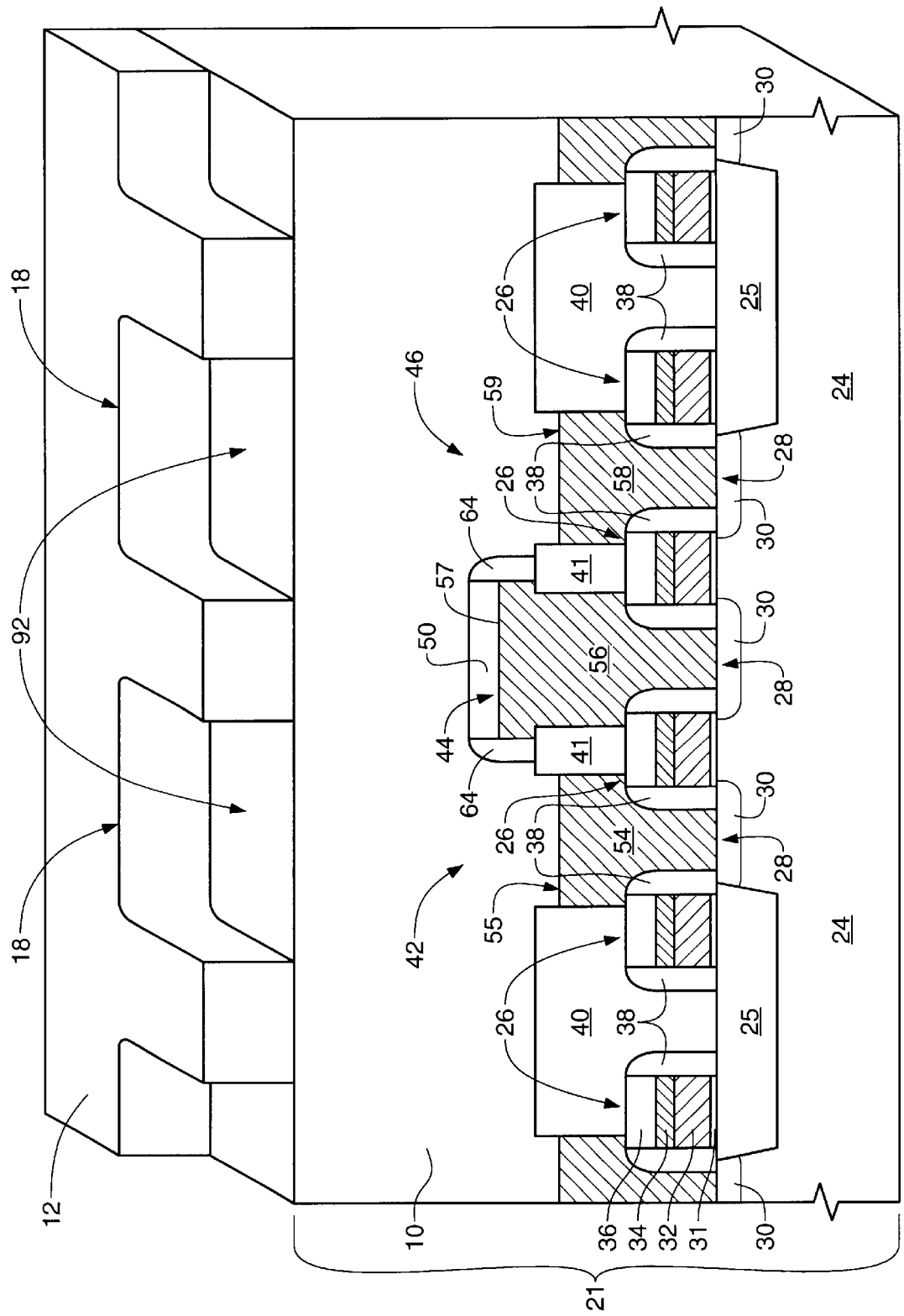
Figure 13:
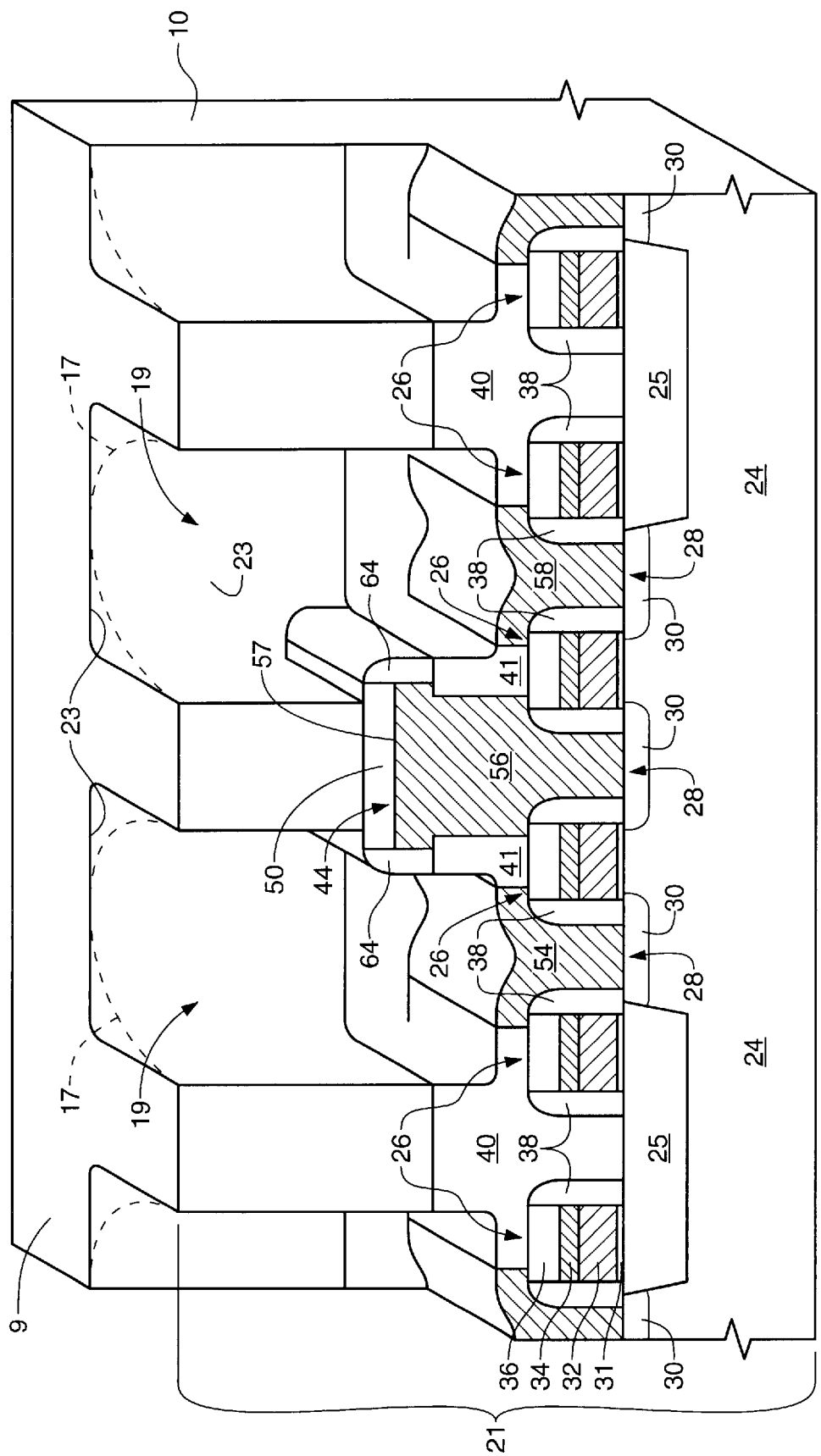

Moving on to FIGS. 12–13, mask 12 (of a particular embodiment of the present invention as described above) is formed over substrate 21. An anisotropic plasma etch is used to etch exposed regions 92 of insulating material 10 of substrate 21. The etch continues sufficiently until exposing portions of plugs 58,54, thereby forming containers 19 of generally rectangular outlines 23 corresponding to the outlines of openings 18 of mask 12. Upon forming containers 19, mask 12 is removed.

The protective materials of cap 50 and spacers 64 are different from insulating material 10 so that insulating material 10 can be etched more favorably relative (selective to) cap 50 and spacers 64. Accordingly, the protective cap 50 and spacers 64 keep plug 56 isolated from the neighboring containers 19. In one exemplary embodiment, when insulating material comprises oxide, protective cap 50 and spacers 64 comprise nitride.

Figure 14:
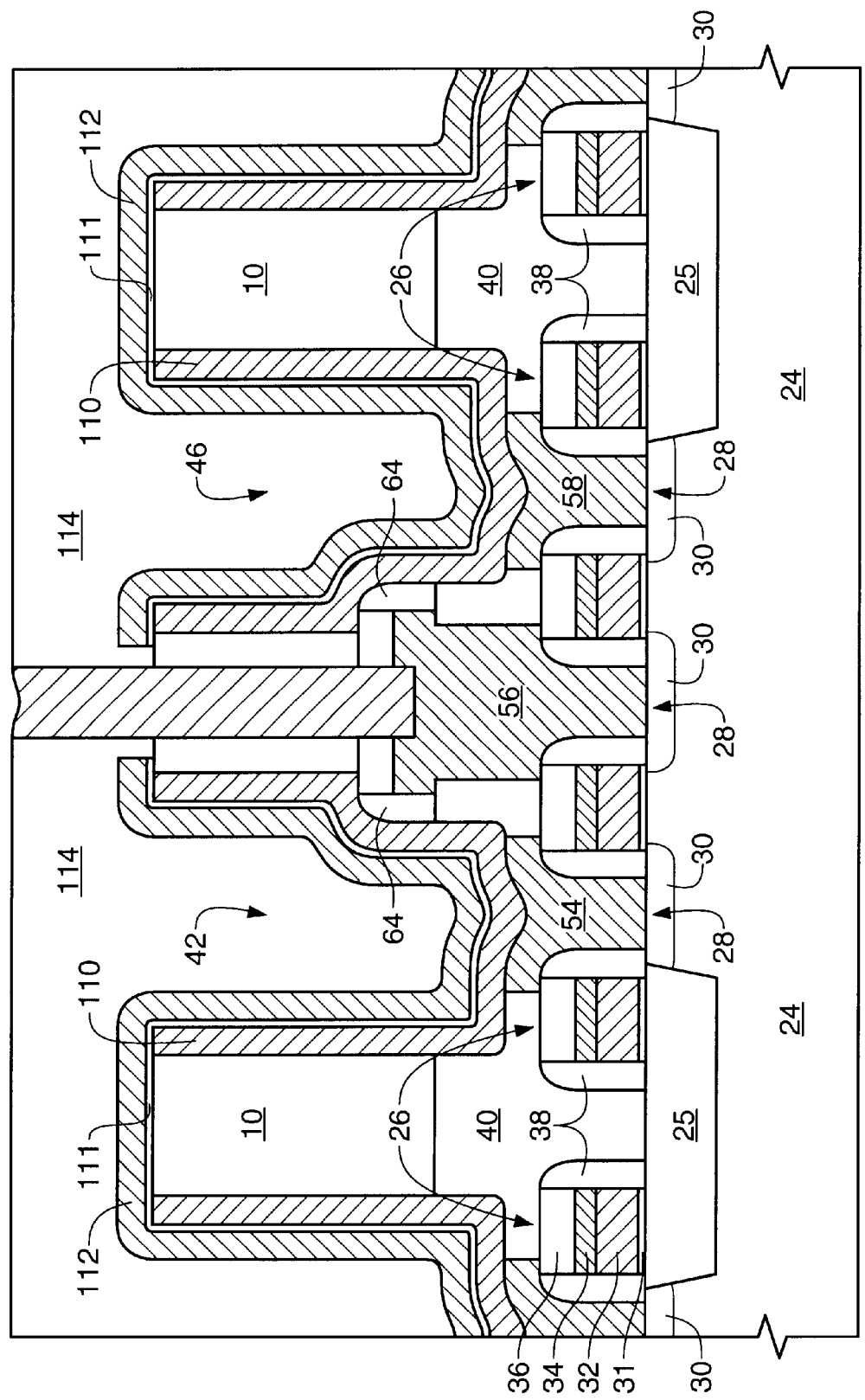

Continuing with reference to FIG. 14, electrically conductive material 110 is layered within containers 19, using a known deposition procedure. In an exemplary embodiment, conductive material 110 comprises hemispherical grain (HSG) polysilicon and is deposited before removal of mask 12. These conductive linings in containers 19 will serve as storage node electrodes for the resulting container-cell capacitors to be formed therein. Dielectric 111, for example, silicon nitride or tantalum pentoxide, is then deposited over conductive material 110. Finally, electrically conductive material 112 is deposited over dielectric 111, providing upper electrodes for capacitors 42,46. By way of the present invention, container-cell capacitors 42,46, have been formed in containers of rectangular or square cross-section, thereby providing greater electrode areas over that which would otherwise be available for cylindrical containers as represented by phantom lines 17 of FIG. 13.

U.S. Pat. Nos. 5,651,855, 6,221,771, and 5,858,877, hereby incorporated by reference, provide exemplary known etching and deposition chemistries.

Accordingly, the present invention provides a mask and method of forming such mask with a fine geometry, rectangular aperture. Further, such mask can be used to form a container of rectangular cross-section within a substrate. Additionally, a container-cell capacitor can be formed within the container to provide a capacitor of electrode area and capacitance greater than that of a similar diameter cylindrical container.

Although the foregoing invention has been described in certain preferred embodiments, other embodiments will become apparent, in view of the disclosure herein. Accordingly, the scope of the invention is, therefore, indicated by the independent claims rather than by the foregoing description. All changes thereto which come within the meaning and range of the equivalency of the claims are to be embraced within the scope of the claims.

What is claimed is:

1. A method of processing a substrate, comprising the steps of:
    providing a substrate;
    forming a first photoresist on said substrate;
    forming light blocking material over said first photoresist;
    forming a second photoresist over said light blocking material;
    patterning said second photoresist to provide an opening therein that exposes a portion of said light blocking material corresponding to a first pattern;
    removing the exposed said light blocking material to uncover a region of said first photoresist;
    irradiating only a portion of said uncovered region of said first photoresist;
    developing and removing the irradiated portion of said first photoresist to form an aperture therein to the substrate; and
    processing a region of sad substrate through said aperture.

2. A method according to claim 1, wherein said step of patterning comprises:
    irradiating a strip of said second photoresist, and
    developing said second photoresist layer to remove the irradiated strip to form the opening in said second photoresist.

3. A method according to claim 2, wherein the irradiated portion of the first photoresist overlaps the opening in said second photoresist.

4. A method according to claim 3, wherein the irradiated portion of the first photoresist is perpendicular to the opening in said second photoresist.

5. A method according to claim 1, wherein said processing comprises etching said substrate through said aperture.

6. A method according to claim 1, wherein said step of irradiating employs ultraviolet light.

7. A method according to claim 1, wherein said step of forming the light blocking layer comprises:
    depositing metal on said first photoresist; and
    forming a dielectric anti-reflective coating on said metal.

8. A method according to claim 7, in which said metal is about 200 to 1,000 angstroms thick.

9. A method of processing a substrate comprising the steps of:
    providing a substrate;
    providing a first photoresist over a substrate;
    providing a light blocking material over said first photoresist;
    forming a groove within said light blocking material to expose a potion of said first photoresist;
    irradiating a strip of The resulting structure, wherein the strip overlaps only a portion of said groove;
    removing the exposed and irradiated portion of said first photoresist to define an opening therein to the substrate; and
    processing a region of said substrate through said mask opening.

10. A method according to claim 9, wherein said strip is substantially perpendicular to said groove.

11. A method according to claim 9, wherein said step of processing comprises etching the region of said substrate.

12. A method according to claim 11, in which said step of etching includes forming a container in said substrate.

13. A method according to claim 9, wherein said step of processing comprises doping the region of said substrate.

14. A method according to claim 9, wherein said step of forming said groove comprises the steps of:
    providing a second photoresist over said light blocking material;
    processing said second photoresist to define an opening that exposes a portion of said light blocking material; and
    removing exposed portions of said light blocking material.

15. A method according to claim 14, further comprising removing said second photoresist before irradiating the strip.

16. A method according to claim 14, further comprising providing a dielectric antireflective layer over said light blocking material and beneath said second photoresist.

17. A method according to claim 14, further comprising providing a non-reflective layer beneath at least one of said first and second photoresists.

18. A method according to claim 17, wherein said non-reflective layer is selected to be non-reflective of ultraviolet light.

19. A method according to claim 12, further comprising a step of forming a capacitor in said container.

20. A method according to claim 19, wherein said step of forming a capacitor comprises:
    forming a first conductive material;
    forming a capacitor dielectric against said first conductive material; and
    forming a conductive material over said capacitor dielectric.

21. A method according to claim 9, further comprising planarizing said substrate prior to providing the first photoresist.

22. A method of processing a substrate, comprising the steps of:
    providing a substrate;
    forming a first resist on the substrate;
    forming a non-polymeric mask material over said first resist, said mask material having a groove;
    removing only a portion of said first resist within the groove of said mask material to form an opening to the substrate; and
    processing a region of said substrate through said opening.

23. A method according to claim 22, in which said processing step comprises implanting the region of said substrate.

24. A method according to claim 22, in which said processing step comprises removing a portion of said substrate.

25. A method according to claim 24, wherein said removing includes etching.

26. A method according to claim 24, wherein said step of removing includes anisotropic plasma etching.

27. A method according to claim 22, wherein said processing step comprises forming a container in the substrate.

28. A method according to claim 27, further comprising forming a capacitor in said container.

29. A method according to claim 22, in which said groove is formed with a width less than 0.5 µm.

30. A method according to claim 29, in which said opening is formed with a width substantially equal to that of said groove.

31. A method according to claim 22, wherein said mask material comprises metal.

32. A method according to claim 31, further comprising the steps of:

forming a second resist over said metal;

patterning said second resist to define a slot; and etching a portion of said metal through said slot to form said groove.

33. A method according to claim 5, wherein said etching comprises anisotropic etching of said substrate to remove portions of said substrate that are exposed by said aperture.

34. A method of processing a substrate, comprising:

providing a substrate;

forming a first photoresist on the substrate;

forming a hard mask on the first photoresist;

removing a first portion of the hard mask to expose the first photoresist;

removing only a portion of the exposed first photoresist within the first portion to form an opening to the substrate; and processing the substrate through the opening.

35. The method of claim 34, wherein the hard mask is a metal.

36. The method of claim 35, wherein the metal is aluminum.

37. The method of claim 35, wherein the hard mask also includes a dielectric layer formed adjacent to the metal.

38. The method of claim 37, wherein the dielectric layer is antireflective.

39. The method of claim 37, wherein the dielectric layer is selected from the group consisting of α-Si or $Si_xO_yN_z$.

40. The method of claim 34, wherein the hard mask is non-polymeric.

41. The method of claim 34, wherein the first photoresist is photosensitive to radiation of a certain wavelength, and the hard mask is opaque to that radiation.

42. The method of claim 34, wherein removing a first portion of the hard mask further comprises:

forming a second photoresist on the hard mask; and patterning and removing a portion of the second photoresist to expose the first portion of the hard mask.

43. The method of claim 34, wherein removing only a portion of the exposed first photoresist within the first portion further comprises:

irradiating a portion of the resulting structure, including the portion of the exposed first photoresist; and processing the resulting structure to remove only the irradiated portion of the exposed first photoresist.

44. The method of claim 43, wherein the first portion and the irradiated portions are overlapping and orthogonal.

45. The method of claim 34, wherein the substrate is a silicon dioxide.

46. The method of claim 34, wherein processing the substrate through the opening includes etching the substrate.

47. The method of claim 46, wherein etching forms a container in the substrate.

48. The method of claim 47, further comprising forming a capacitor in the container.

49. The method of claim 5, wherein etching forms a container in the substrate.

50. The method of claim 49, further comprising forming a capacitor in the container.

* * * * *

UNITED STATES PATENT AND TRADEMARK OFFICE
CERTIFICATE OF CORRECTION

PATENT NO. : 6,410,453 B1
DATED : June 25, 2002
INVENTOR(S) : Gurtej S. Sandhu

It is certified that error appears in the above-identified patent and that said Letters Patent is hereby corrected as shown below:

Column 7,
Line 53, delete "The" and insert -- the --

Column 8,
Line 51, delete "said remov-" and insert -- said step of remov- --
Line 58, delete "forming" and insert -- a step of forming --

Signed and Sealed this

Twelfth Day of November, 2002

Attest:

Attesting Officer

JAMES E. ROGAN
Director of the United States Patent and Trademark Office